United States Patent
Fu et al.

(10) Patent No.: US 10,198,397 B2
(45) Date of Patent: Feb. 5, 2019

(54) FLOW CONTROL IN REMOTE DIRECT MEMORY ACCESS DATA COMMUNICATIONS WITH MIRRORING OF RING BUFFERS

(71) Applicant: Microsoft Technology Licensing, LLC, Redmond, WA (US)

(72) Inventors: Chen Fu, Cupertino, CA (US); John Grant Bennett, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/356,076

(22) Filed: Nov. 18, 2016

(65) Prior Publication Data

US 2018/0143939 A1    May 24, 2018

(51) Int. Cl.
*G06F 3/00* (2006.01)
*G06F 15/167* (2006.01)
(Continued)

(52) U.S. Cl.
CPC .......... *G06F 15/167* (2013.01); *G06F 3/0604* (2013.01); *G06F 3/064* (2013.01);
(Continued)

(58) Field of Classification Search
None
See application file for complete search history.

(56) References Cited

U.S. PATENT DOCUMENTS 5,548,728 A * 8/1996 Danknick ............... G06F 5/065
709/213
6,775,245 B1 * 8/2004 Ishida ..................... H04L 49/90
370/257
(Continued)

FOREIGN PATENT DOCUMENTS

EP    2045973 A1 *  4/2009  .......... H04L 1/1835

OTHER PUBLICATIONS

Dragojevic, et al., "FaRM: Fast Remote Memory", Published on: May 20, 2015 Available at: https://blog.acolyer.org/2015/05/20/farm-fast-remote-memory/.
(Continued)

*Primary Examiner* — Daniel F. McMahon
(74) *Attorney, Agent, or Firm* — The Watson I.P. Group, PLC; Vladan M. Vasiljevic

(57) ABSTRACT

Two computing devices utilizing remote direct memory access establish a send ring buffer on a sending computer and a receive ring buffer on a receiving computer that mirror one another. A message is copied into the ring buffer on the sending computer and a write edge pointer is updated to identify its end. The message is copied, by the sending computer, from its ring buffer into a ring buffer on the receiving computer. A process executing on the receiving computer periodically checks, at its write edge pointer, and, upon detecting the new message's header, it updates the location identified by the write edge pointer. Once the new message is copied out of the ring buffer at the receiving computer, a trailing edge pointer is updated and a process (Continued)

executing at the sending computer monitors the trailing edge pointer of the receiving computer and updates its own trailing edge pointer accordingly.

20 Claims, 6 Drawing Sheets

(51) Int. Cl.
    *G06F 3/06*     (2006.01)
    *G06F 11/10*     (2006.01)
    *H03M 13/09*     (2006.01)
    *G06F 13/28*     (2006.01)
    *G06F 15/173*     (2006.01)

(52) U.S. Cl.
    CPC .............. *G06F 3/065* (2013.01); *G06F 3/067* (2013.01); *G06F 3/0619* (2013.01); *G06F 11/1004* (2013.01); *G06F 13/28* (2013.01); *G06F 15/17331* (2013.01); *H03M 13/09* (2013.01)

(56) References Cited

U.S. PATENT DOCUMENTS

| | | | |
|---|---|---|---|
| 7,937,499 B1 | 5/2011 | Tripathi | |
| 8,127,074 B2* | 2/2012 | Rostedt | G06F 11/3636 711/110 |
| 8,874,681 B2 | 10/2014 | Aho et al. | |
| 2003/0061417 A1 | 3/2003 | Craddock et al. | |
| 2003/0141897 A1* | 7/2003 | Bentz | G06F 5/10 326/38 |
| 2004/0131074 A1* | 7/2004 | Kurth | G06F 5/10 370/428 |
| 2005/0223118 A1 | 10/2005 | Tucker et al. | |
| 2007/0130445 A1 | 6/2007 | Lau et al. | |
| 2008/0235409 A1 | 9/2008 | Ryzhykh | |
| 2008/0313364 A1 | 12/2008 | Flynn et al. | |
| 2009/0083392 A1 | 3/2009 | Wong et al. | |
| 2009/0319733 A1 | 12/2009 | Ma | |
| 2012/0131124 A1 | 5/2012 | Frey et al. | |
| 2013/0067160 A1 | 3/2013 | Ostrovsky et al. | |
| 2013/0080564 A1 | 3/2013 | Aho et al. | |
| 2013/0086183 A1 | 4/2013 | Frank et al. | |
| 2013/0103777 A1 | 4/2013 | Kagan et al. | |
| 2014/0089444 A1* | 3/2014 | Makhervaks | G06F 15/17331 709/212 |
| 2015/0026286 A1 | 1/2015 | Sharp et al. | |

OTHER PUBLICATIONS

"RDMA over Converged Ethernet", Retrieved on: Sep. 21, 2016 Available at: https://en.wikipedia.org/wiki/RDMA_over_Converged_Ethernet.
"InfiniBand", Retrieved on: Sep. 21, 2016 Available at: https://en.wikipedia.org/wiki/InfiniBand.
"iWarp", Retrieved on: Sep. 21, 2016 Available at: https://en.wikipedia.org/wiki/IWarp.
Liu, et al., "High Performance RDMA-Based MPI Implementation over InfiniBand", In Proceedings of the 17th Annual ACM International Conference on Supercomputing, Jun. 23, 2003, 10 pages.
"Circular buffer", Retrieved on: Sep. 21, 2016 Available at: https://en.wikipedia.org/wiki/Circular_buffer.
Balaji, et al., "Advanced Flow-control Mechanisms for the Sockets Direct Protocol over InfiniBand", In Proceedings of the International Conference on Parallel Processing, Sep. 10, 2007, pp. 1-21.
"International Search Report and Written Opinion Issued in PCT Application No. PCT/US2017/059143", dated Feb. 20, 2018, 12 Pages.

\* cited by examiner

FLOW CONTROL IN REMOTE DIRECT MEMORY ACCESS DATA COMMUNICATIONS WITH MIRRORING OF RING BUFFERS

BACKGROUND

Computing devices can exchange digital data through communications transmitted across computer networks to which such computing devices are communicationally coupled via network interface hardware. Traditionally, to communicate digital data from a sending computing device to a receiving computing device across a network, network interface hardware of the sending computing device receives a copy of the digital data to be transmitted, and then transmits such digital data, in accordance with relevant network communication protocols, to the receiving computing device, whose network interface hardware receives the digital data, a copy of which can then be further made, on the receiving computing device, in order to enable processes, executed by a general-purpose central processing unit of such a receiving computing device, to access the received data. Consequently, the transmission of digital data can involve the making of multiple copies of such data, both at the sending computing device, and at the receiving computing device.

Remote direct memory access communications can enable a sending computing device to transmit data without first making a copy of such data for the network interface hardware on such a sending computing device. Instead, remote direct memory access communications can enable the network interface hardware of a sending computing device to access data directly from memory in which such data was stored by an application program seeking to transmit such data across the network. Remote direct memory access communications can also enable the network interface hardware of the sending computing device to write data directly into the memory of a receiving computing device, via the network interface hardware of the receiving computing device, but without making an additional copy on the receiving computing device.

While remote direct memory access communications can enable more efficient communication of digital data between a sending computing device and a receiving computing device across a computer network, such efficiencies can be sub-optimally realized, or even negated, if the communication of digital data is not coordinated properly. Traditional coordination mechanisms, often referred to as "flow control" mechanisms, or protocols, rely on functionality, implemented by the network interface hardware, that is not universal across multiple different types of network interface hardware, rendering such traditional coordination mechanisms only applicable in homogenous network interface hardware environments. Other traditional flow control mechanisms rely on the maintenance of credits of available, equivalently-sized buffers into which digital data, being communicated across the network, can be written. But such equivalently sized buffers can result in data fragmentation, or can yield inefficiencies if the data being transmitted is smaller than the buffer, often resulting in the transmission of meaningless filler data.

SUMMARY

Two computing devices utilizing remote direct memory access to exchange digital data across a computer network can establish ring buffers, where a send ring buffer on a sending computing device and a receive ring buffer on a receiving computing device can mirror one another through mechanisms that monitor the ring buffers and memory locations identified by a write edge and a trailing edge pointer. A message to be transmitted can be copied into a ring buffer on the sending computing device. A write edge pointer can be updated to identify a location within the ring buffer at which point the message ends, with the remainder of the ring buffer remaining available for the storage of other messages to be sent. The message can then be copied, by the sending computing device, from its ring buffer into a ring buffer on the receiving computing device that is to mirror the ring buffer on the sending computing device. A process executing on the receiving computing device can periodically check data at a location within the ring buffer that is identified by a write edge pointer. Upon detecting a header of a new message, the process can update the location in the ring buffer that is identified by the write edge pointer to now identify the end of the new message, such as based on a size of the message that can have been contained within the header. Once the new message is copied out of the ring buffer at the receiving computing device, a trailing edge pointer can be incremented to identify a memory location within the ring buffer that is after the message data that was copied out, thereby making available additional memory within the ring buffer to be utilized for the receipt of subsequent messages. A periodic process executing at the sending computing device can monitor the trailing edge pointer of the receiving computing device and can update its own trailing edge pointer when it detects a change in the location identified by the trailing edge pointer of the receiving computing device. In such a manner, messages can be exchanged through remote direct memory access while utilizing ring buffers whose data and metadata are updated at both the sending and receiving computing devices to mirror one another.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
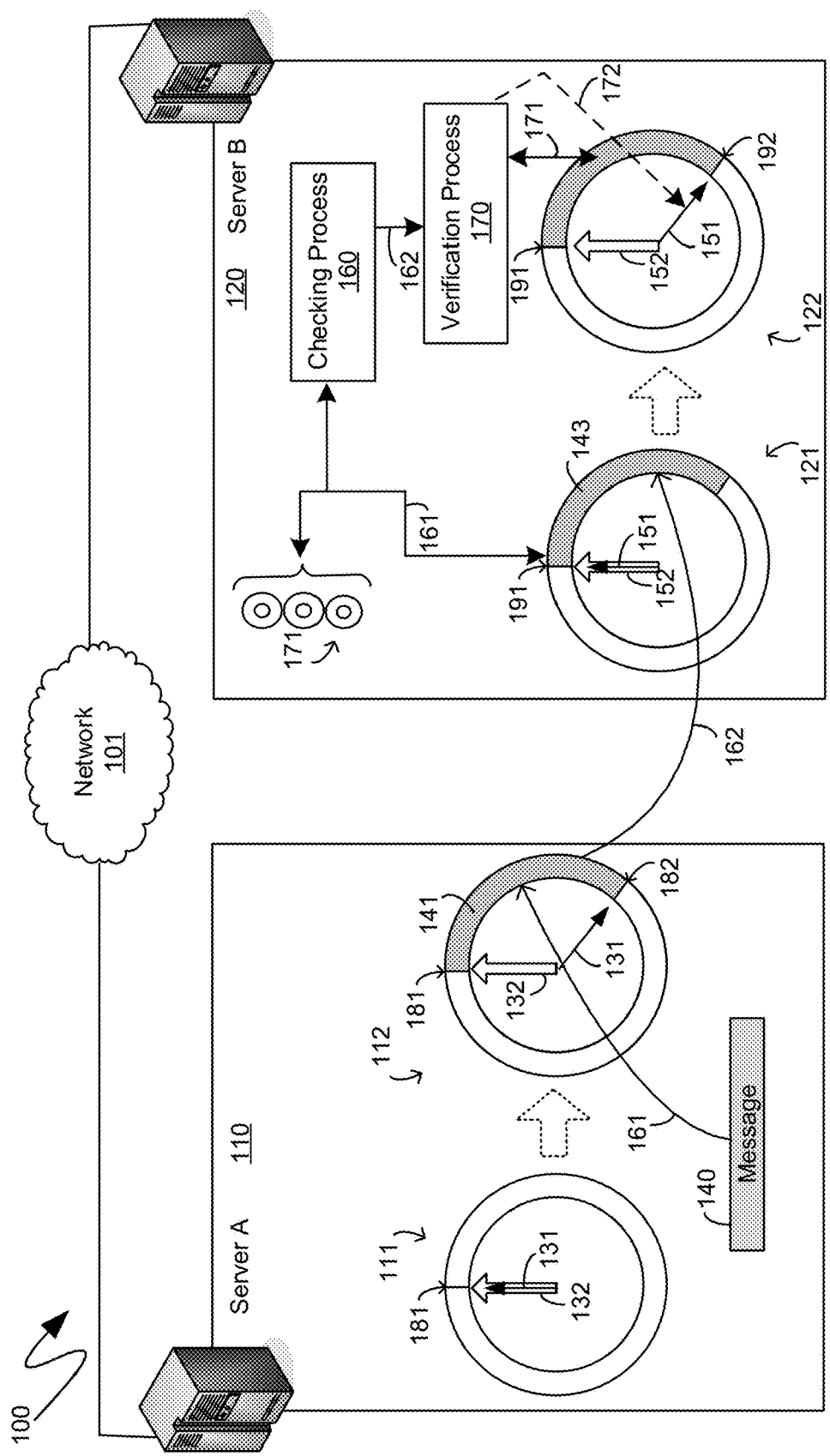
FIG. 1 is a block diagram of an exemplary data communication between computing devices.

The following description relates to flow control mechanisms for a computing device exchanging digital data across a computer network utilizing remote direct memory access. The flow control mechanisms can be implementable via ring buffers, such as where a send ring buffer on a sending computing device and a receive ring buffer on a receiving computing device can mirror one another. A message to be transmitted can be copied into a ring buffer on the sending computing device. A write edge pointer can be updated to identify a location within the ring buffer at which point the message ends, with the remainder of the ring buffer remaining available for the storage of other messages to be sent. The message can then be copied, by the sending computing device, from its ring buffer into a ring buffer on the receiving computing device that is to mirror the ring buffer on the sending computing device. A process executing on the receiving computing device can periodically check data at a location within the ring buffer that is identified by a write edge pointer. Upon detecting a header indicative of a new message, the process can update the location in the ring buffer that is identified by the write edge pointer to now identify the end of the new message, such as based on a size of the message that can have been contained within the header. Once the new message is copied out of the ring buffer at the receiving computing device, a trailing edge pointer can be updated to identify the same memory location within the ring buffer that was previously identified by the write edge pointer after it was updated to account for the message, thereby making the memory that the message consumed now available within the ring buffer to be utilized for the receipt of subsequent messages. A periodic process executing at the sending computing device can monitor the trailing edge pointer of the receiving computing device and can update its own trailing edge pointer when it detects a change in the location identified by the trailing edge pointer of the receiving computing device. In such a manner, messages can be exchanged through remote direct memory access while utilizing ring buffers whose data and metadata are updated at both the sending and receiving computing devices to mirror one another.

The techniques described herein make reference to Remote Direct Memory Access (RDMA) communications. However, the mechanisms described are not limited to that specific communicational mechanism, and can be utilized with any mechanism by which two or more discrete and independent computing devices can communicationally transfer digital data between them by writing data directly into the other's memory.

Although not required, some of the descriptions below will be in the general context of computer-executable instructions, such as program modules, being executed by a computing device, including, specifically, by either general-purpose central processing units, or customized processing units, such as would be found on a network interface card that can be considered to be part of the computing device executing the computer-executable instructions. More specifically, the description will reference acts and symbolic representations of operations that are performed by one or more computing devices, peripherals, or combinations thereof, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Generally, program modules include routines, programs, objects, components, data structures, and the like that perform particular tasks or implement particular abstract data types. Moreover, those skilled in the art will appreciate that the computing devices need not be limited to conventional personal computers, and include other computing configurations, including hand-held devices, multi-processor systems, microprocessor based or programmable consumer electronics, network PCs, servers, minicomputers, mainframe computers, and the like. Similarly, the computing devices need not be limited to stand-alone computing devices, as the mechanisms may also be practiced in distributed computing environments where tasks are performed by remote processing devices that are linked through a communications network. In a distributed computing environment, program modules may be located in both local and remote memory storage devices.

With reference to FIG. 1, an exemplary system 100 is shown therein comprising two discreet computing devices in the form of the exemplary server computing device 110 and the exemplary server computing device 120. For purposes of the descriptions below, the exemplary computing devices 110 and 120 are illustrated as being communicationally coupled to one another through a network 101. Although detailed further below, the makeup, structure and nature of the exemplary network 101 are immaterial to the descriptions below, and the mechanisms described herein, except to the extent that the exemplary network 101 enables the computing devices that are communicationally coupled therethrough, such as the exemplary computing devices 110 and 120, to perform the actions, and exchange the communications, detailed below.

A computing device seeking to utilize the mechanisms described herein to communicate digital data with other computing devices can establish one or more ring buffers. As utilized herein, the term "ring buffer" means a sequence of memory locations that, through the operation of a computing device, are treated as a contiguous and continuous looped sequence of memory locations, such that a piece of digital data stored at an end of the ring buffer is considered as, and is treated as, being stored immediately prior to a piece of digital data stored at a beginning of the ring buffer. To establish a ring buffer, a computing device can set aside, or register, a portion of its memory, and can then provide the relevant memory interface processes to facilitate treatment of that portion of memory as if it were connected end-to-end, thereby forming a "ring". The descriptions below will make reference to pointers associated with ring buffers, and in such a context, such pointers can be stored in memory, outside of the ring buffer, and identify discrete memory locations, or addresses, within the portion of memory that is being treated as a ring buffer.

According to one aspect, a computing device can establish a send ring buffer to store digital data that will be transmitted from the computing device and a separate receive ring buffer to store digital data that will be received by the computing device. Each communicational connection, from the computing device, to a separate computing device, can comprise its own discrete send and receive ring buffers. Thus, for example, a computing device maintaining hundreds of simultaneous communicational connections can simultaneously maintain hundreds of pairs of send and receive ring buffers. In the detailed descriptions below, a single communication of digital data from a sending computing device to a receiving computing device is provided for illustrative and descriptive simplicity. Consequently, the descriptions below reference only a single ring buffer on a single computing device, namely a send ring buffer on a sending computing device and a corresponding, and mirrored, receive ring buffer on a receiving computing device. However, as detailed above, is to be understood that the descriptions below are merely describing one aspect of the improved flow control mechanisms described herein and that analogous, or equivalent, aspects of those flow control mechanisms would be implemented for communications of digital data in the opposite direction. Thus, it is to be understood that while the detailed descriptions below only describe, for example, a send ring buffer on a sending computing device, such a computing device can also comprise, for the same communicational connection being described, a receive ring buffer for when that sending computing device acts as a receiving computing device within the context of the same communicational connection being described.

Within the context of the exemplary system 100 of FIG. 1, as part of the establishment of a communicational channel, in accordance with the mechanisms detailed herein, between the exemplary computing device 110 and the exemplary computing device 120, the exemplary computing device 110 can set aside a portion of its memory to be treated as a send ring buffer, such as exemplary send ring buffer 111. As will be recognized by those skilled in the art, such a registration of memory can comprise the passing of a token, from the processes establishing, and maintaining, the memory of the send ring buffer 111, to, for example, a network interface card, or network communication processes executing on the exemplary computing device 110. Analogously, exemplary computing device 120 can set aside a portion of its memory to be treated as a receive ring buffer, such as the exemplary receive ring buffer 121, and, analogously, the network interface card, or network communication processes executing on exemplary computing device 120, can receive a token, such as from the process establishing, and maintaining, the memory of the receive ring buffer 121, that can provide access to data stored within the receive ring buffer 121. Again, as detailed above, the establishment of communications between, for example, exemplary computing devices 110 and 120 shown in FIG. 1, can entail each computing device to set aside portions of its memory to be treated as both a send ring buffer and, separately, a receive ring buffer, on each computing device. However, for purposes of illustrative and descriptive simplicity, only the exemplary send ring buffer 111, on the sending computing device, namely the exemplary computing device 110 in the illustrated example, and only the exemplary receive ring buffer 121, on the receiving computing device, name the exemplary computing device 120 in the illustrated example, are specifically shown in the figures, such as in FIG. 1.

Although not specifically illustrated in FIG. 1, as part of the establishment of the communicational channel between the exemplary computing devices 110 and 120, exemplary computing device 120 can provide to the relevant processes on the exemplary computing device 110, such as to networking processes, or to the network interface card itself, the token that can enable the exemplary computing device 110, or, more specifically, the network interface card of the exemplary computing device 110, to directly access those portions of the memory of the exemplary computing device 120 that have been established as the exemplary receive ring buffer 121. In addition, each of the computing devices can exchange with the other information indicative of starting addresses, within their memory, of the send ring buffer 111 and receive ring buffer 121, respectively, as well as the size of those ring buffers. Other information that can be exchanged can be the locations, in the memories of the respective computing devices, in which the write edge pointer is stored and in which the trailing edge pointer is stored. Those memory addresses can enable processes to read from them the write edge and trailing edge pointers and, thereby, identify which memory locations in the ring buffers are identified, or pointed to, by the write edge and trailing edge pointers, respectively.

According to one aspect, each ring buffer can have two pointers, identifying memory locations within the ring buffer. For nominative simplicity, those two pointers are referred to herein as a "write edge pointer" and a "trailing edge pointer". The write edge pointer can identify an "end" of data within the ring buffer, beyond which are fragments of data that are no longer useful or relevant. The trailing edge pointer can identify a "beginning" of data, prior to which are fragments of data that are no longer useful or relevant. As utilized herein, the adjective "beginning", as applied to data, means the first one or more bits of such data that are to be consumed first if the data is to be understood in its intended manner. Similarly, as utilized herein, the adjective "end", as applied to data, means the last one or more bits of such data beyond which the data does not extend in memory.

Initially, prior to the transmission of any data, the exemplary send ring buffer 111 can comprise the write edge pointer 131 and the trailing edge pointer 132 both identifying a same memory location 181 within the exemplary send ring buffer 111. Upon detection or receipt of data that is to be transmitted, from the exemplary computing device 110 to the exemplary computing device 120, such data can be copied into the send ring buffer. For example, FIG. 1 illustrates the copying of a message 140 into the send ring buffer. More specifically, the arrow 161 illustrates the copying of the message 140 into a portion of the send ring buffer, with the data comprising the message 140 now stored as data 141 within the send ring buffer. Additionally, the initial configuration of the send ring buffer, shown as the exemplary send ring buffer 111, is illustrated as being updated to a subsequent configuration of the send ring buffer, shown as the exemplary send ring buffer 112. As will be understood by those skilled in the art, the exemplary send ring buffer 112 is not a separate ring buffer from the exemplary ring buffer 111, but rather represents a state of the exemplary send ring buffer 111 after the copying therein of the message 140.

As can be seen from FIG. 1, according to one aspect, the copying of the message 140, as data 141, into the send ring buffer can trigger the updating of the write edge pointer 131 to now identify a memory location 182. The memory between the memory location 181, still identified by the trailing edge pointer 132 in the updated send ring buffer 112, and the memory location 182, identified by the updated write edge pointer 131, can comprise the data 141, of the message 140, as stored in the send ring buffer of the exemplary computing device 110.

According to one aspect, as part of the copying of the message 140 into the send ring buffer, metadata can be added to the data of the message 140. Such metadata can include header information, footer information, error correction codes, and combinations thereof. For example, the header can be added to the message 140 to identify the message 140 as a new message. Such a header can also specify a size of the message. Alternatively, or in addition, such a header can also include an error correction code by which proper receipt of the data of the message can be verified. For example, and as will be recognized by those skilled in the art, a Cyclic Redundancy Check (CRC) code, or value, can be generated, such as by performing known mathematical operations on some or all of the data of the message 140, and such a CRC value can be included as part of the header. In a similar manner, a footer can be added to the message 140 to identify the end of the message. For example, such a footer can mirror the information of the header including, for example, a specification of the size of the message, as well as a CRC value of the message. Alternatively, the footer may comprise only some of such information, such as the CRC value.

Because the generation of an error correction code, such as a CRC value, can entail the sequential reading of the data of the message 140, the generation of an error correction code can be combined with the copying of the message 140 into the send ring buffer 112 as the data 141, since such a copy operation can also entail the sequential reading of the data of the message 140. By combining such operations, an optimization can be achieved in that the data of the message 140 can be read only once, or, more accurately, only transferred once from memory to a processing unit, such as the central processing unit of the computing device 110.

Once header and/or footer information is added to the message 140, and stored in the ring buffer 112 as data 141, such data 141 can be written directly into the memory of the exemplary server computing device 120, as graphically illustrated by the arrow 162. For example, the network interface card of the exemplary computing device 110 can utilize RDMA actions, such as an RDMA Write command, to directly access the memory of the exemplary computing device 120 that was set aside as the receive ring buffer 121, such as with the token associated with such a receive ring buffer 121 that can have been previously provided, by the exemplary computing device 12 to the network interface card of the exemplary computing device 110. As another example, other networking procedures that similarly allow for direct access, by networking aspects of the exemplary computing device 110, to the memory of the exemplary computing device 120, can similarly be utilized.

As shown in FIG. 1, the data 141, comprising the message 140, can be read from the send ring buffer 112 on the exemplary computing device 110, and can be written directly into the receive ring buffer 121, as the data 143, on the exemplary computing device 120. However, when utilizing certain direct memory access networking functionality, such as the RDMA Write command referenced above, processes executing on the exemplary computing device 120 may not be aware of the new data 143 written into the memory, such as the receive ring buffer 121, of the exemplary computing device 120. Consequently, as illustrated in FIG. 1, even after the data 143 is written directly into the receive ring buffer 121, a write edge pointer 151 and a trailing edge pointer 152, both associated with the receive ring buffer 121, can continue to identify a same memory location 191.

According to one aspect, as part of the improved flow control detailed herein, the exemplary computing device 120 can have a checking process executing, such as exemplary checking process 160, which can periodically examine the data in the receive ring buffer 121 at the location 191 in memory identified by the write edge pointer 151 to determine if the new data, such as exemplary data 143, has been written into the receive ring buffer 121. For greater efficiency, according to one aspect, the checking process 160 can perform such a check on multiple receive ring buffers, such as the exemplary multiple receive ring buffers 171, associated with other communicational connections being maintained by the exemplary computing device 120. For example, the checking process 160 can cycle through and sequentially check each of the exemplary multiple receive ring buffers 171, and then the receive ring buffer 121, before repeating the process again. Such checking is illustrated by the arrow 161 in FIG. 1.

If the checking process 160 detects the new data 143, such as starting at the memory location 191 being checked by the checking process 160, and identified by the write edge 151 of the receive ring buffer 121, the checking process 160 can trigger a verification process 170, such as is illustrated by the arrow 162. Although the verification process 170 is illustrated as a separate process from the checking process 160, those of skill in the art will recognize that the operations performed by the verification process 170 can be equally performed by sub routines, subcomponents, or other like aspects of the checking process 160, and the descriptions provided are not meant to indicate that the verification process 170 must execute as a separate process from the checking process 160.

According to one aspect, the verification process 170 can utilize error detection codes to verify proper receipt of the new data 143. For example, the verification process 170 can first confirm that all of the new data 143 has been received. Such a confirmation can be performed by, for example, comparing a header of the new data 143, which should have been received first, and which can have been detected by the checking 161 performed by the checking process 160, to a footer of the new data 143, which can be the last data received. If the header and footer match, such as if they comprise similar, analogous, or otherwise matching information, a determination can be made that all of the new data 143 has been received and processing can proceed to further verify proper receipt of the new data 143. Such further verification can, for example, compute a CRC value of the new data 143 and compare such a computed value to an expected value, such as can be contained in the header of the new data 143, the footer of the new data 143, or combinations thereof. One mechanism by which the footer can be identified can be the size information contained in the header, since it can be known that the footer is the last of the data 143. Such a verification process is illustrated by the arrow 171. If such a verification fails, the aforedescribed actions can be repeated until the data 141 is successfully copied to the computing device 120.

If the new data 143 is verified as properly having been received into the receive ring buffer 121, the write edge pointer 151 can be changed to now identify a subsequent location 192 such that the advancement of the write edge pointer 151 from the location 191, previously identified by such a write edge pointer 151, to the new location 192, can be an advancement by an amount equal to the size of the new data 143, such as can have been specified in the header of the new data 143. An updated version of the receive ring buffer 121, with the write edge pointer 151 now advanced to point to the memory location 192, is illustrated as the updated version of the receive ring buffer 122 in FIG. 1. Again, as before, the ring buffer 122 is not meant to illustrate a separate and independent receive ring buffer from the ring buffer 121, but is merely meant to represent the state of the ring buffer 121 after updating the write edge pointer 151 in the manner described. The updating of the write edge pointer 151 is illustrated by the arrow 172. Additionally, although illustrated and described as being triggered by the verification process 170, the updating of the write edge pointer 151 can also be triggered by the checking process 160, such as immediately subsequent to the checking process 160 detecting the new data 143, since, as detailed previously, the header of the new data 143 can comprise a size of the new data 143, enabling the checking process 160, for example, to advance the write edge pointer 151 to the memory location 192 without actually waiting for the rest of the new data 143 to be written into memory on the exemplary computing device 120.

As can be seen in FIG. 1, the updated receive ring buffer 122, on the computing device 120, can comprise the write edge pointer 151 and a trailing edge pointer 152 that mirror the locations of the corresponding write edge pointer 131 and the corresponding trailing edge pointer 132 of the updated send ring buffer 112 on the computing device 110.

Figure 2:
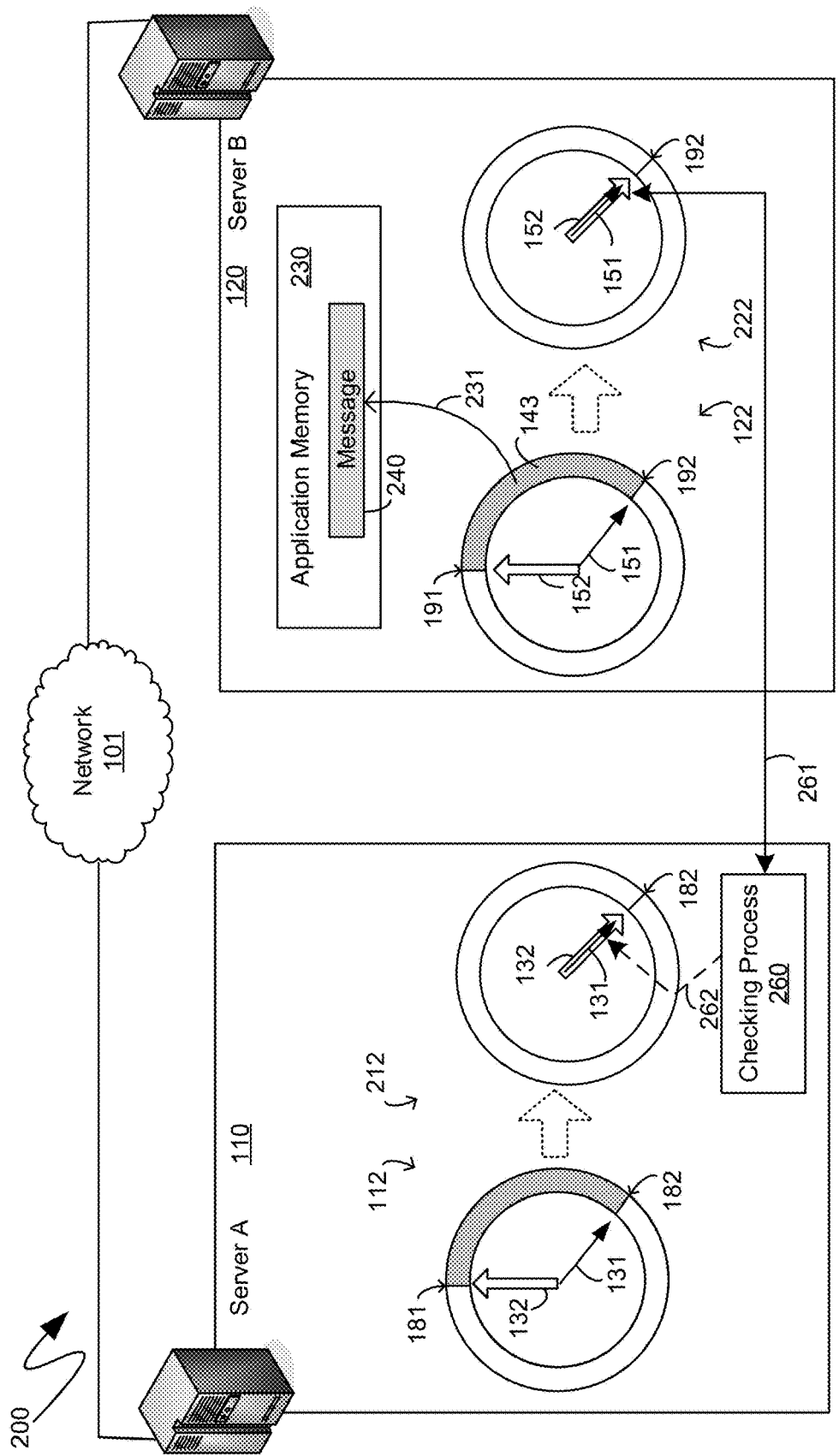
FIG. 2 is a block diagram of another aspect of an exemplary data communication between computing devices.

Turning to FIG. 2, the system 200 shown therein illustrates a subsequent sequence of operations, subsequent to those illustrated in FIG. 1. In particular, once the new data 143 is verified, such as in the manner detailed previously, it can be copied out of the receive ring buffer 122 and provided to an application as the message 240, being a copy of the message 140, except now stored on the exemplary server computing device 120, instead of the exemplary server computing device 110 as illustrated in FIG. 1. For example, an application associated with the application memory 230 can have registered a callback, an interrupt, or other like notification mechanism by which such an application can be notified when the new data 143 is received and verified. Once such an application is notified of the new data 143, the application can copy the data 143 into application memory 230, as the message 240. Such a copy action is illustrated by the arrow 231 in FIG. 2. Alternatively, the application can consume the data 143 in some other manner and can provide a notification that the data 143 no longer needs to be retained in the receive ring buffer 122. As yet another example, the data 143 can be copied out of the receive ring buffer 122 by processes independent of the application, including by processes performing the mechanisms described herein. The data 143 can be copied out of the receive ring buffer 122 to another memory storage location, such as a temporary buffer or other like storage location. The data 143 can then be provided to an application from such a temporary buffer. However, because such a copy out of the receive ring buffer 122 can be under the control of the same processes performing the mechanisms described herein, a conformation or notification that the data 143 has been copied out of the receive ring buffer 122 need not be explicitly generated in such an instance.

Once the data 143 has been consumed, such as by being copied out of the receive ring buffer 122, whether by an application or other processes, it no longer needs to be retained within the receive ring buffer 122, and the trailing edge pointer 152 can be updated to indicate that the space previously consumed by the data 143 can now be consumed by still other data being copied into the receive ring buffer 122, such as by the network interface card of the computing device 110. Consequently, as illustrated in FIG. 2, the updated receive ring buffer 222, being an illustration of an update to the receive ring buffer 122, can have the trailing edge pointer 152 updated to a location 192 that is subsequent to the data 143 that was copied out of the receive ring buffer 122.

According to one aspect, the checking process 260, executing on the exemplary server computing device 110, can monitor a memory location, of the exemplary server computing device 120, at which the trailing edge pointer 152 is stored. Such a monitoring is illustrated in FIG. 2 by the arrow 261. For example, the checking process 260 can utilize the token provided previously to access, not only memory, of the computing device 120, storing the receive ring buffer 122, but to also access to the memory, of the computing device 120, that contains the trailing edge pointer 152. Upon detecting that the trailing edge pointer 152 is updated, such as to now point to the memory location 192 in the receive ring buffer 222, the checking process 260 can accordingly update the trailing edge buffer 132 of the send ring buffer at the computing device 110. The updated send ring buffer 212 is illustrated in FIG. 2 as being an update to the send ring buffer 112, now illustrating that both the write edge buffer 131 and the trailing edge buffer 132 both identify a same memory location 182 within the send ring buffer 212. The updating of the trailing edge buffer 132, by the checking process 260, is illustrated by the arrow 262.

As can be seen, after the operations detailed herein, the send ring buffer 212, on the server computing device 110, mirrors the receive ring buffer 222 on the computing device 120, in that both ring buffers have their respective write edge pointers and trailing edge pointers identifying a same location in memory at each of the respective computing devices.

According to one aspect, the trailing edge pointer, such as the exemplary trailing edge pointer 132, can delineate between memory locations of the send ring buffer 112 that can accommodate new data to be transmitted, and memory locations that still retain data currently being transmitted. Thus, the updating, and incrementing, of the trailing edge pointer 132 of the send ring buffer 112, such as in the manner illustrated by the updated send ring buffer 212, enables a greater quantity of data to be written into the send ring buffer 212 and communicated across the network 101 to the computing device 120. Consequently, according to one aspect, the checking process 260 need not continually check the trailing edge pointer 152 of the receive ring buffer on the computing device 120, but can, instead, only check the trailing edge pointer 152 when additional space is needed in the send ring buffer on the computing device 110. Alternatively, or in addition, the checking process 260 can be triggered by a quantity of available space in the send ring buffer on the computing device 110 dropping below a predetermined threshold amount, threshold percentage, or other like threshold. According to yet another aspect, the checking process 260 can be triggered by the copying of data from the send ring buffer on the computing device 110 into the receive ring buffer on the computing device 120. In other words, the checking process 260 can be triggered to check for an update to the trailing edge pointer 152, on the computing device 120, when there is a reason to expect such an update, such as when new data has been copied over and is waiting to be consumed by an application on the computing device 120. Consequently, according to one aspect, when the write edge pointer 131 and the trailing edge pointer 132, on the computing device 110, identify a same location in memory, such as the location 182, there can be no need for the checking process 262 monitor the trailing edge pointer 152, on the computing device 120, since there is no data that has been transmitted, but has not yet been received and consumed by one or more application programs executing on the computing device 120.

As can be seen from the detailed descriptions provided, data can be written into a send ring buffer so long as there is sufficient memory space between the memory location, of the send ring buffer, identified by the write edge pointer 131, and a subsequent memory location, looping around the ring buffer, identified by the trailing edge pointer 132. As such data is written into the second ring buffer, the write edge pointer 131 can be updated in accordance the size of such data, and such data can be copied over and written directly into the receive ring buffer of the remote computing device receiving such data. Concurrently, as data is read out of the receive ring buffer on the remote computing device, the trailing edge pointer 152 of the receive ring buffer on such a remote computing device can be updated, and a checking process 260 on the sending computer 110 can, accordingly, update the trailing edge pointer 132 of the send ring buffer on such a sending computing device. In such a manner an improved flow control can be achieved for direct memory access data communications that is not dependent upon, nor does it require, any specialized functionality of the network interface hardware and/or software on either computing device beyond that detailed herein.

Figure 3:
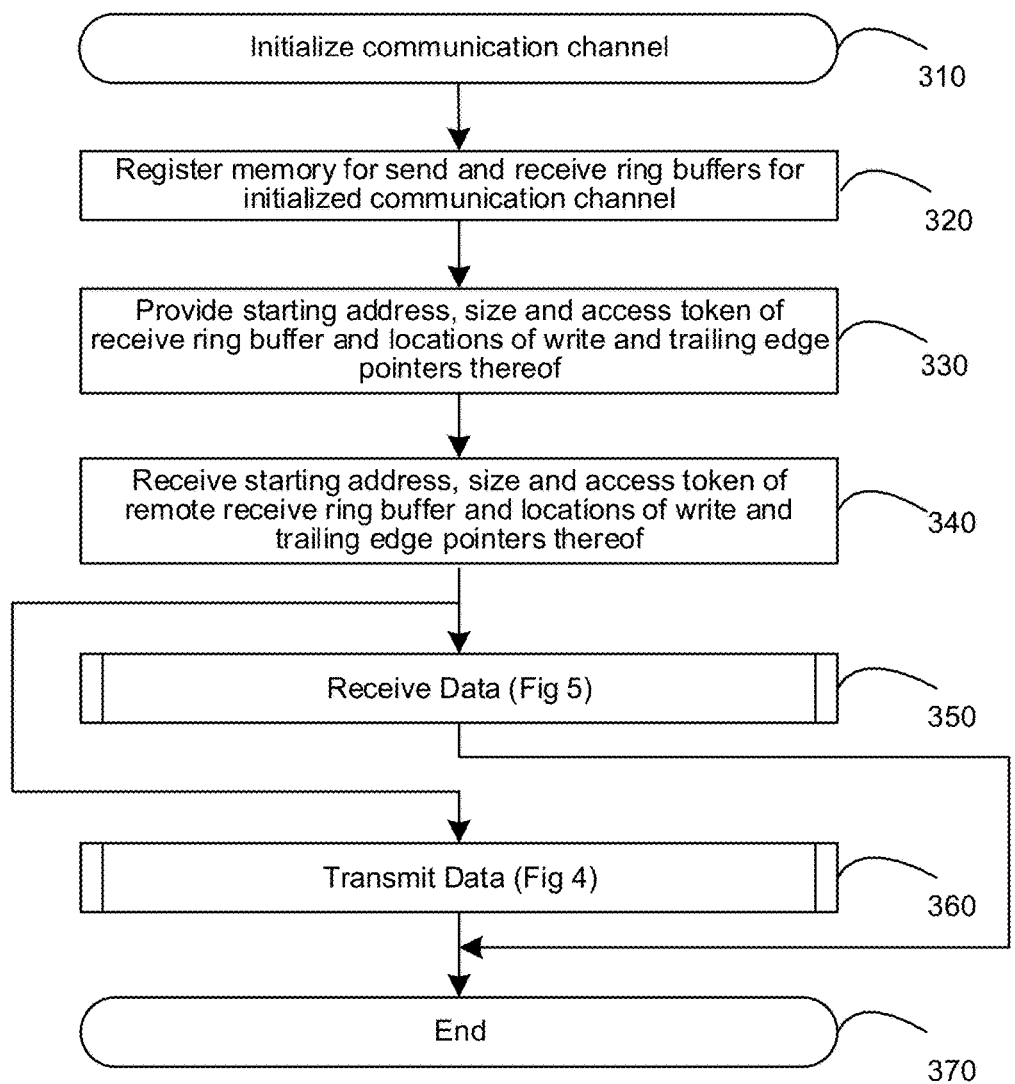
FIG. 3 is a flow diagram of an exemplary data communication between computing devices.

Turning to FIG. 3, the exemplary flow diagram 300 shown therein illustrates an exemplary series of actions that can be performed on a computing device seeking to utilize the aforedescribed improved flow control mechanisms in connection with remote direct memory access data communications. More specifically, the exemplary flow diagram 300 illustrates an initial step 310 during which a communication channel, such as between two computing devices seeking to exchange digital data and otherwise communicate with one another, can be established. Subsequently, at step 320, memory of the computing device performing the steps of the flow diagram 300 can be registered to establish a send ring buffer and a receive ring buffer on such a local computing device. The send ring buffer and receive ring buffer registered at step 320 can be for the communicational channel initialized at step 310, and each communicational channel can have its own send ring buffer and receive ring buffer. According to one aspect, negotiations between computing devices, such as would occur during step 310, can negotiate a common size, between the two computing devices, for the send and receive ring buffers. For example, a send or receive ring buffer can be sized to be two or three times larger than a largest message, or message segment, that is expected to be sent across the communicational channel established at step 310. In another example, the size of the send ring buffer on the local computing device can be different from the size of the receive ring buffer on the local computing device, while the send ring buffer on the local computing device can be the same size as the corresponding receive ring buffer on the remote computing device and, vice versa, the receive ring buffer on the local computing device can be the same size as the corresponding send ring buffer on the remote computing device.

Once the memory registration to establish the send and receive ring buffers, on the computing device performing the steps of the flow diagram 300, has completed, processing can proceed to step 330 at which point the starting address, size and access token of the receive ring buffer can be provided to the remote computing device of the communicational channel established at step 310. Additionally, the locations, within the memory of the computing device that is performing the steps of the flow diagram 300, of the write edge pointers, of the send and receive ring buffers, and the trailing edge pointers, of the send and receive ring buffers, can be provided. Analogously, at step 340, the starting address, size and access token of the remote receive ring buffer can be received from such a remote computing device. And, also at step 340, the locations, within the memory of the remote computing device, of the write edge pointers, of the send and receive ring buffers, and the trailing edge pointers, of the send and receive ring buffers, can be provided. Upon completion of step 340, according to one aspect, remote direct memory access data communications can be exchanged, utilizing the improved flow control mechanisms described herein, with the remote computing device. Such communications can entail simultaneous bidirectional communications, including the receipt of data, from the remote computing device, concurrently with the sending of data to the remote computing device. Consequently, the receiving data subprocess 350 and the transmitting data subprocess 360 are illustrated in the exemplary flow diagram 300 of FIG. 3 as occurring concurrently. Moreover, as indicated previously, various checks are performed to verify proper transmission of data and to detect errors. Should errors be detected, or should glitches or improper operation corrupt the above described descriptions, the communication channel, initialized at step 310, can be terminated at step 370 and a new communication channel can be, if appropriate, initialized. Similarly, once there is no longer need for the communicational channel established at step 310, such a communicational channel can be explicitly terminated at step 370 by various relevant networking processes.

Figure 4:
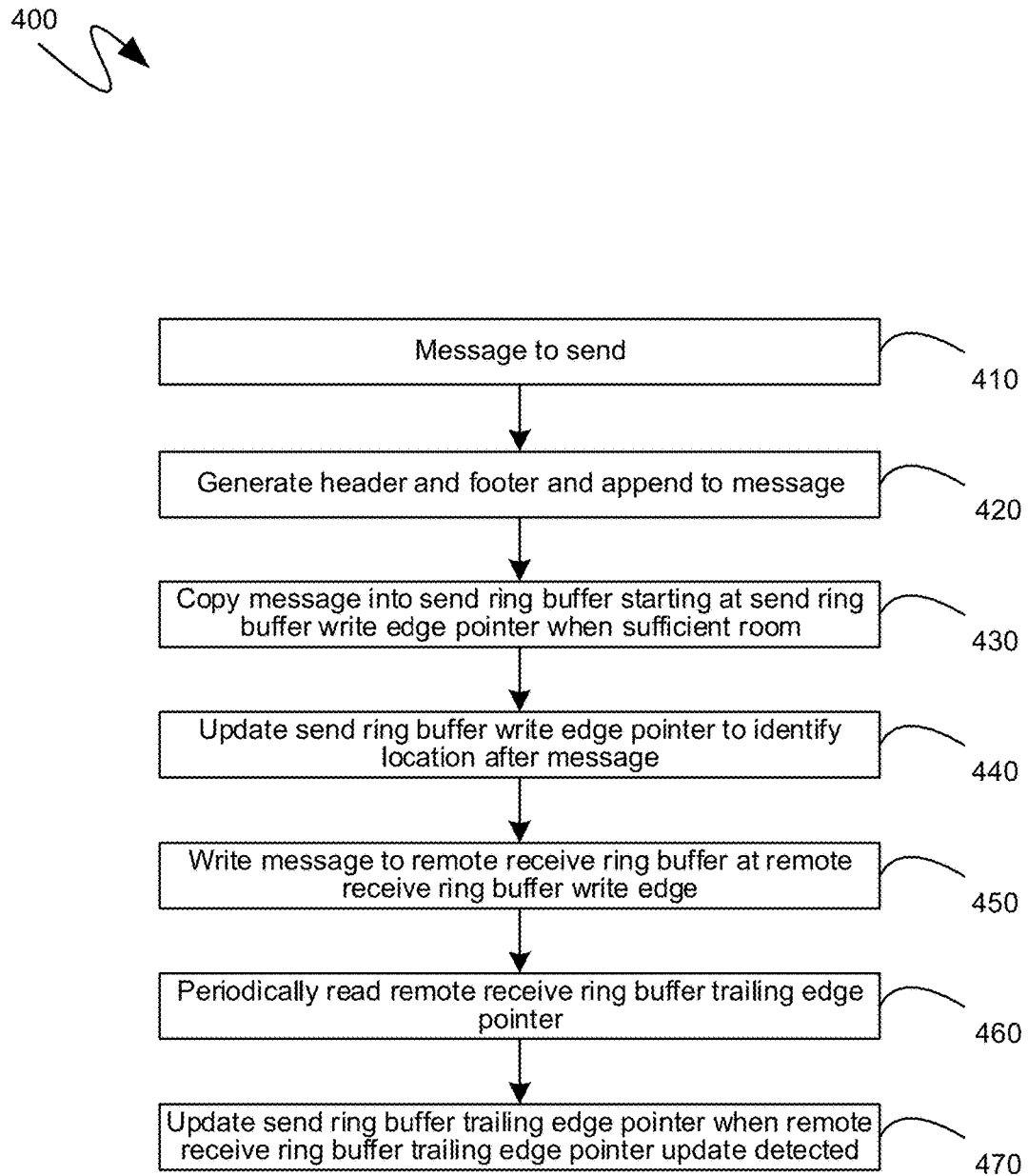
FIG. 4 is a block diagram of another aspect of an exemplary data communication between computing devices.

Turning to FIG. 4, the exemplary flow diagram 400 shown therein illustrates an exemplary transmit data subprocess, such as that represented by step 360 of the flow diagram 300 of FIG. 3. With reference to FIG. 4, as part of the transmit data subprocess, a message to send can be received at step 410. Such a message can be provided to the relevant networking hardware or software, such as through a pre-arranged notification or other like mechanism by which a higher level application program can inform lower-level networking processes of the desire to send a collection of data to remote computing device. At step 420, a header and/or footer for the message can be generated and appended to the message. As detailed above, a message header can comprise a size of the message, error correcting code that can be utilized to verify correct transmission of the message data, and other like information. Similarly, a footer can comprise the error correcting code, the size, or other like information. As also indicated previously, both the message header and the footer can be optional such that a message can have one, both, or neither. At step 430 the data of the message, including any headers or footers, such as those generated at step 420, can be copied into a send ring buffer starting at a memory location of the send ring buffer identified by a write edge pointer. According to one aspect, the copying of the message into the send ring buffer can commence only after verification that there is sufficient room in the send ring buffer. Additionally, as described above, steps 420 and 430 can be combined to enable the data of the message to be read from memory to a processing unit only once.

Once the date of the message has been copied into the send ring buffer, the write edge pointer of the send ring buffer can be updated, at step 440, to identify a new memory location, within the send ring buffer, that is after the end of the message that has been copied into the send ring buffer. Such an update of the send ring buffer write edge pointer enables additional messages to be copied into the send ring buffer, and subsequently transmitted, while the remaining steps, such as of the exemplary flow diagram 400, are performed with respect to the message received at step 410.

Subsequently, at step 450, the message data, including any header and/or footer, can be written directly into the remote computing device's receive ring buffer at a memory location, within such a receive ring buffer, identified by that receive ring buffer's write edge pointer. For example, such a transfer of data can be performed using the RDMA Write command. As indicated previously, the writing of the message data directly into the remote computing device's memory can be performed utilizing the memory access token provided by the remote computing device and received at step 340, as shown in FIG. 3. To confirm when the message data has been read out of the receive ring buffer on the remote computing device, a checking process can execute, such as at step 460, to periodically read a memory location, on the remote computing device, that comprises the trailing edge pointer of the receive ring buffer on the remote computing device. When such a checking process detects an update to the memory location specified, or identified, by the trailing edge pointer of the receive ring buffer on the remote computing device, processing can proceed to step 470, and the trailing edge pointer of the send ring buffer, on the computing device performing the steps of the exemplary flow diagram 400, can be updated accordingly. More specifically, the memory location, within the send ring buffer, on the computing device performing the steps of the exemplary flow diagram 400, that is identified by the trailing edge pointer can be changed to match the corresponding memory location, within the receive ring buffer, on the remote computing device, that is now identified by the trailing edge pointer after the update to the trailing edge pointer that was detected at step 460.

Figure 5:
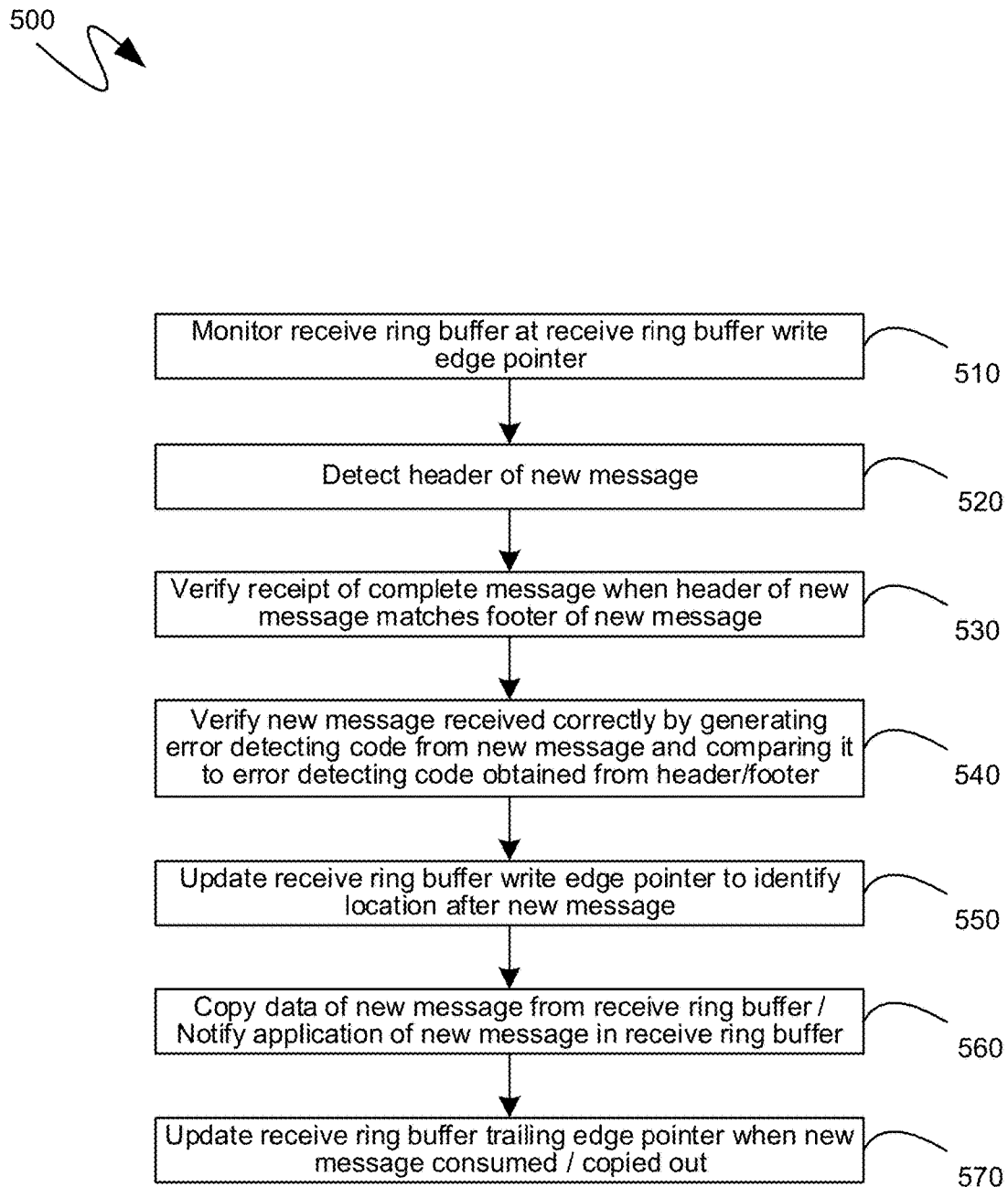
FIG. 5 is a flow diagram of yet another aspect of an exemplary data communication between computing devices.

Turning to FIG. 5, the exemplary flow diagram 500 shown therein illustrates an exemplary receive data subprocess, such as that represented by step 350 of the flow diagram 300 of FIG. 3. With reference to FIG. 5, as part of the receive data subprocess, a receive ring buffer can be monitored at a memory location, within the receive ring buffer, that is identified by the receive ring buffer's write edge pointer. A new message, commencing at the monitored memory location, can be detected, such as at step 520, by detecting data in the form of a header, which can specify information about the message including, for example, a size of the message, and error detecting code associated with the message, or other like information. Processing can then proceed to step 530 to verify completed receipt of the message, such as by detecting a valid footer, or comparing footer information to header information including, for example, the size of the message specified, or the error detecting code associated with the message. According to one aspect, the location of a footer can be determined based on message size information contained within the header detected at step 520.

Subsequently, at step 540, proper receipt of the data of the new message can be verified by generating an error detecting code, such as by hashing the message, or otherwise applying known mathematical functions to the data of the message, and comparing the generated error detecting code to the error detecting code contained in, for example, the header that was detected at step 520, or the footer identified at step 530, or combinations thereof. If step 540 does not verify that the data of the new message was properly received, retransmission of the message data can be requested. Once proper receipt of the data of the new message is verified, at step 540, the memory location, within the receive ring buffer, identified by the write edge pointer can be incremented to accommodate for the size specified, thereby identifying a memory location, within the receive ring buffer, that is subsequent to the end of the message. The message can then be copied out of the receive ring buffer at step 560. As detailed above, such a copying can be directly performed, such as by the mechanisms performing the steps of the exemplary flow diagram 500, in which case the message data can be copied to another buffer from which it can be accessed by one or more application programs to which such message data was directed. Alternatively, at step 560, an application can be notified of a new message waiting for it in the receive ring buffer, and the application can copy the message out of the receive ring buffer, such as into the application's own memory space. Once the message has been read from the receive ring buffer, the memory location, within the receive ring buffer, identified by the trailing edge pointer can be updated, or incremented, based on the size of the message that has been read out of the receive ring buffer. Such an action can then free up additional memory capacity within the receive ring buffer to receive still further messages.

Figure 6:
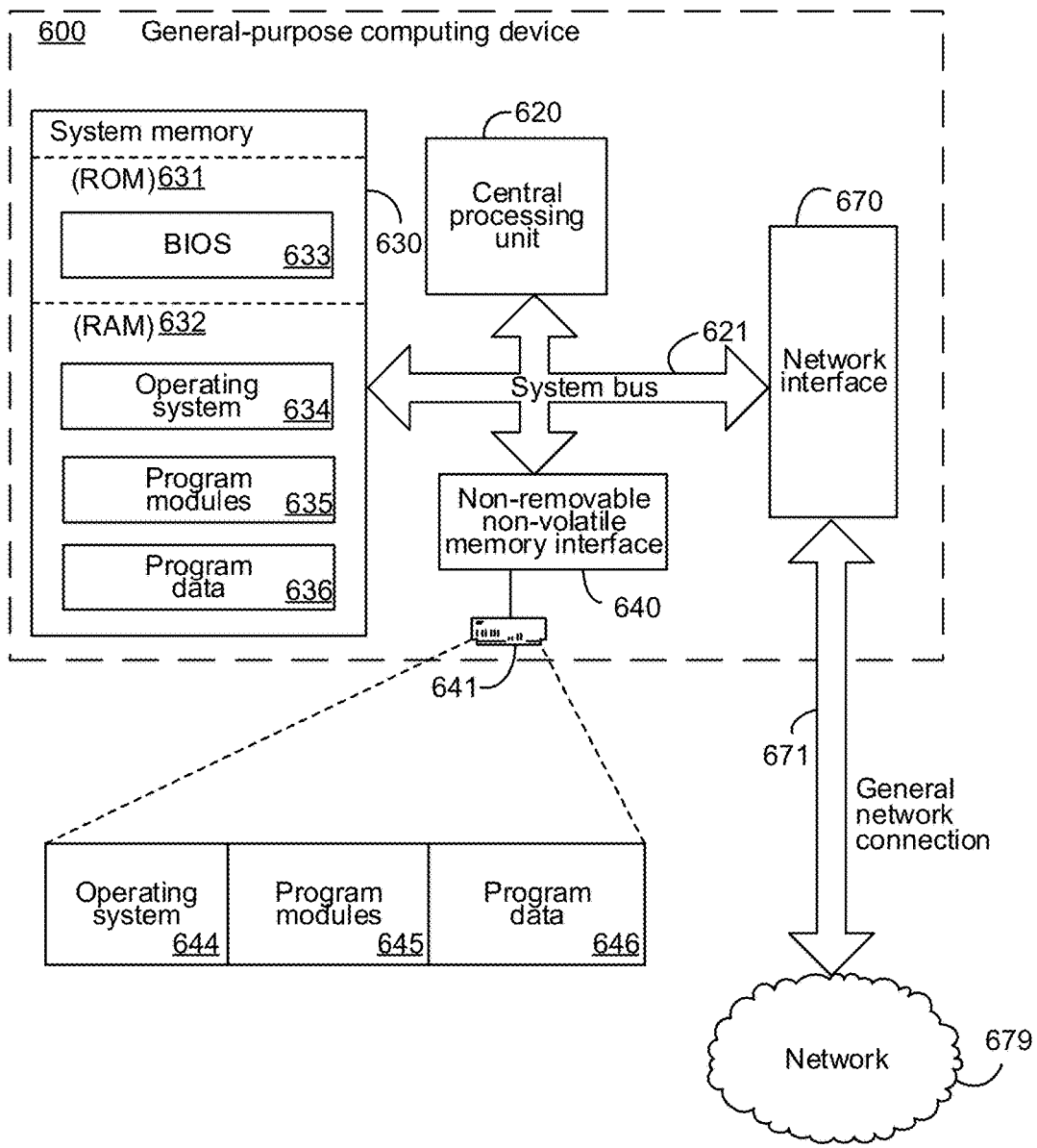
FIG. 6 is a block diagram of an exemplary computing device.

Turning to FIG. 6, an exemplary computing device 600 is shown therein comprising one or more general-purpose processing units, such as the exemplary CPU 620, as well as a system memory 630, and a system bus 621 that couples various system components including the system memory to the processing unit 620. The system bus 621 may be any of several types of bus structures including a memory bus or memory controller, a peripheral bus, and a local bus using any of a variety of bus architectures. Depending on the specific physical implementation, one or more of the CPUs 620, the customized integrated circuit 650, the system memory 630 and other components of the computing device 600 can be physically co-located, such as on a single chip or silicon die or on a single circuit board. In such a case, some or all of the system bus 621 can be nothing more than silicon pathways within a single chip structure or on a single die and its illustration in FIG. 6 can be nothing more than notational convenience for the purpose of illustration.

The computing device 600 also typically includes computer readable media, which can include any available media that can be accessed by computing device 600 and includes both volatile and nonvolatile media and removable and non-removable media. By way of example, and not limitation, computer readable media may comprise computer storage media and communication media. Computer storage media includes media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 600. Computer storage media, however, does not include communication media. Communication media embodies computer readable instructions, data structures, program modules or other data in a modulated data signal such as a carrier wave or other transport mechanism and includes any information delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 630 includes computer storage media in the form of volatile and/or nonvolatile memory such as read only memory (ROM) 631 and random access memory (RAM) 632. A basic input/output system 633 (BIOS), containing the basic routines that help to transfer information between elements within computing device 600, such as during start-up, is typically stored in ROM 631. RAM 632 typically contains data and/or program modules that are immediately accessible to and/or presently being operated on by processing unit 620. By way of example, and not limitation, FIG. 6 illustrates operating system 634, other program modules 635, and program data 636.

The computing device 600 may also include other removable/non-removable, volatile/nonvolatile computer storage media. By way of example only, FIG. 6 illustrates a hard disk drive 641 that reads from or writes to non-removable, nonvolatile magnetic media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and other computer storage media, as defined and delineated above. The hard disk drive 641 is typically connected to the system bus 621 through a non-volatile memory interface such as interface 640.

The drives and their associated computer storage media discussed above and illustrated in FIG. 6, provide storage of computer readable instructions, data structures, program modules and other data for the computing device 600. In FIG. 6, for example, hard disk drive 641 is illustrated as storing operating system 644, other program modules 645, and program data 646. Note that these components can either be the same as or different from operating system 634, other program modules 635 and program data 636. Operating system 644, other program modules 645 and program data 646 are given different numbers hereto illustrate that, at a minimum, they are different copies.

The computing device 600 may operate in a networked environment using logical connections to one or more remote computers. The computing device 600 is illustrated as being connected to the general network connection 671 through a network interface or adapter 670, which is, in turn, connected to the system bus 621. In a networked environment, program modules depicted relative to the computing device 600, or portions or peripherals thereof, may be stored in the memory of one or more other computing devices that are communicatively coupled to the computing device 600 through the general network connection 671. It will be appreciated that the network connections shown are exemplary and other means of establishing a communications link between computing devices may be used.

Although described as a single physical device, the exemplary computing device 600 can be a virtual computing device, in which case the functionality of the above-described physical components, such as the CPU 620, the system memory 630, the network interface 670, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where the exemplary computing device 600 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executed within the construct of another virtual computing device. The term "computing device", therefore, as utilized herein, means either a physical computing device or a virtualized computing environment, including a virtual computing device, within which computer-executable instructions can be executed in a manner consistent with their execution by a physical computing device. Similarly, terms referring to physical components of the computing device, as utilized herein, mean either those physical components or virtualizations thereof performing the same or equivalent functions.

The descriptions above include, as a first example, a computing device comprising: one or more processing units; a network interface card; and one or more computer-readable media comprising computer-executable instructions, which, when executed by the processing units or the network interface card, cause the computing device to: utilize a first portion of memory as a first ring buffer such that a beginning data location at a beginning of the first portion of memory is used as a sequentially subsequent data location from an end data location at an end of the first portion of memory; update a first write edge pointer associated with the first ring buffer to account for new data being transmitted, the first write edge pointer identifying an end, within the first portion of memory, of data being transmitted from the computing device; copy at least some of the new data being directly into a second ring buffer at a receiving computing device; monitor a second trailing edge pointer, associated with the second ring buffer, to detect an update to a location identified by the second trailing edge pointer; and update a first trailing edge pointer associated with the first ring buffer in accordance with the updated location identified by the second trailing edge pointer and detected by the monitoring, the first trailing edge pointer identifying a beginning, within the first portion of memory, of the data being transmitted from the computing device.

A second example is the computing device of the first example, wherein the computer-readable media comprise further computer-executable instructions, which, when executed, cause the computing device to: copy a first message, comprising data to be transmitted from the computing device to the receiving computing device, into the first ring buffer starting at a location identified by the first write edge pointer immediately prior to the copying; wherein the updating the first write edge pointer to account for the new data being transmitted comprises incrementing the location identified by the first write edge pointer immediately prior to the copying by a size of the first message.

A third example is the computing device of the second example, wherein the computer-readable media comprise further computer-executable instructions, which, when executed, cause the computing device to: modify the first message to comprise a header prior to copying the first message into the first ring buffer, the header comprising an indication of a size of the first message.

A fourth example is the computing device of the second example, wherein the computer-readable media comprise further computer-executable instructions, which, when executed, cause the computing device to: generate, from the first message, an error detecting code of the first message; and modify the first message to comprise a header prior to copying the first message into the first ring buffer, the header comprising the error detecting code of the first message.

A fifth example is the computing device of the fourth example, wherein the computer-readable media comprise further computer-executable instructions, which, when executed, cause the computing device to: further modify the first message to comprise a footer prior to copying the first message into the first ring buffer, the footer also comprising the error detecting code of the first message.

A sixth example is the computing device of the first example, wherein the computer-executable instructions causing the copying directly into the second ring buffer comprise further computer-executable instructions, which, when executed, cause the computing device to: copy the at least some of the data directly into the second ring buffer at a second write edge pointer identifying, within the second ring buffer, where a previously copied data ended.

A seventh example is the computing device of the first example, wherein the monitoring the second trailing edge pointer is triggered by the copying.

An eighth example is the computing device of the first example, wherein the monitoring the second trailing edge pointer is triggered by a determination that a space left in the first ring buffer for new data to be transmitted from the computing device is below a pre-determined threshold, wherein the space left in the first ring buffer commences with a first memory location, within the first portion of memory, identified by the first write edge pointer and ends with a second memory location, within the first portion of memory, identified by the first trailing edge pointer.

A ninth example is the computing device of the first example, wherein the monitoring the second trailing edge pointer is triggered by a determination that a space left in the first ring buffer for new data to be transmitted from the computing device is insufficient to accommodate a next message to be transmitted, wherein the space left in the first ring buffer commences with a first memory location, within the first portion of memory, identified by the first write edge pointer and ends with a second memory location, within the first portion of memory, identified by the first trailing edge pointer.

A tenth example is the computing device of the first example, wherein the computer-executable instructions causing the monitoring are not executed if the first write edge pointer and the first trailing edge pointer identify a same location within the first portion of memory.

An eleventh example is a computing device comprising: one or more processing units; a network interface card; and one or more computer-readable media comprising computer-executable instructions, which, when executed by the processing units or the network interface card, cause the computing device to: utilize a first portion of memory as a first ring buffer such that a beginning data location at a beginning of the first portion of memory is used as a sequentially subsequent data location from an end data location at an end of the first portion of memory; monitor data immediately subsequent to a first location, in the first portion of memory, identified by a first write edge pointer, associated with the first ring buffer, to detect new data being received from a sending computing device, the first write edge pointer identifying an end, within the first portion of memory, of data previously received from the sending computing device; update the first write edge pointer to account for the new data that was detected; and update a first trailing edge pointer associated with the first ring buffer, after the new data has been copied out of the first ring buffer, the first trailing edge pointer identifying an end, within the first portion of memory, of a portion of the data previously received from the sending computing device that has not yet been copied out of the first ring buffer.

A twelfth example is the computing device of the eleventh example, wherein the new data is detected by detecting data in a form of a header commencing immediately subsequent to the first location.

A thirteenth example is the computing device of the eleventh example, wherein the computer-executable instructions causing the updating of the first write edge pointer comprise further computer-executable instructions, which, when executed, cause the computing device to: increment the first write edge pointer in accordance with a size of the new data as specified in a header of the new data.

A fourteenth example is the computing device of the eleventh example, wherein the computer-readable media comprise further computer-executable instructions, which, when executed, cause the computing device to: obtain an error detecting code associated with the first new data; and verify the new data in the first ring buffer with the obtained error detecting code.

A fifteenth example is the computing device of the fourteenth example wherein the error detecting code is specified in both a header and a footer of the new data.

A sixteenth example is the computing device of the eleventh example wherein the computer-readable media comprise further computer-executable instructions, which, when executed, cause the computing device to: determine that the new data that was detected has completed being received from the sending computing device based on a footer of the new data comprising identifying information matching identifying information specified in a header of the new data.

A seventeenth example is the computing device of the eleventh example, wherein the computer-readable media comprise further computer-executable instructions, which, when executed, cause the computing device to: provide, to an application executing on the computing device, a notification that the new data is in the first ring buffer; and receiving, from the application, an indication that the new data has been copied out of the first ring buffer.

An eighteenth example is the computing device of the eleventh example, wherein the first write edge pointer, after the updating thereof, and the first trailing edge pointer, after the updating thereof, both identify a same location within the first portion of memory.

A nineteenth example is a method of improving flow control in remote direct memory access data communications between a sending computing device and a receiving computing device, the method comprising: utilizing a first portion of a sending computing device memory as a send ring buffer; utilizing a first portion of a receiving computing device memory as a receive ring buffer; updating, at the sending computing device, a first write edge pointer associated with the send ring buffer to account for new data being transmitted; copying, by the sending computing device, at least some of the new data directly into the receive ring buffer at the receiving computing device; monitoring, at the receiving computing device, data immediately subsequent to a first location identified by a second write edge pointer associated with the receive ring buffer, to detect the new data; updating, at the receiving computing device, the second write edge pointer to account for the new data that was detected; updating, at the receiving computing device, a first trailing edge pointer associated with the receive ring buffer, after the new data has been copied out of the receive ring buffer at the receiving computing device; monitoring, from the sending computing device, the first trailing edge pointer associated with the receive ring buffer on the receiving computing device, to detect the updating thereof; and updating, at the sending computing device, a second trailing edge pointer associated with the send ring buffer in accordance with the detected updating of the first trailing edge pointer.

A twentieth example is the method of the nineteenth example wherein the monitoring the second trailing edge pointer is triggered by the copying.

As can be seen from the above descriptions, improved flow control in remote direct memory access data communications through the mirroring of ring buffers has been presented. In view of the many possible variations of the subject matter described herein, we claim as our invention all such embodiments as may come within the scope of the following claims and equivalents thereto.

We claim:

1. A computing device utilizing an improved flow control for remote direct memory access communications, the computing device comprising:
   one or more processing units;
   a network interface card; and
   one or more computer-readable media comprising computer-executable instructions, which, when executed by the processing units or the network interface card, cause the computing device to utilize the improved flow control for the remote direct memory access communications by:
      utilizing a first portion of memory as a first ring buffer such that a beginning data location at a beginning of the first portion of memory is used as a next storage location after an end data location at an end of the first portion of memory, thereby utilizing the first portion of memory in a recirculating manner;
      updating a first write edge pointer associated with the first ring buffer to identify an end of a first data being transmitted from the computing device;
      copying at least some of the first data directly into a second ring buffer at a receiving computing device;
      monitoring a second trailing edge pointer, associated with the second ring buffer, to detect an update to the second trailing edge pointer; and
      updating a first trailing edge pointer associated with the first ring buffer in accordance with the update to the second trailing edge pointer;
      wherein a second data, being transmitted from the computing device after the first data, will be stored in the first portion of memory such that the first trailing edge pointer, after the updating of the first trailing edge pointer, identifies a beginning of the second data.

2. The computing device of claim 1, wherein the computer-readable media comprise further computer-executable instructions, which, when executed, cause the computing device to:
   copy, prior to the updating of the first write edge pointer, a first message, comprising the first data, into the first ring buffer based on the first write edge pointer immediately prior to the copying;
   wherein the updating the first write edge pointer to account for the first data comprises modifying the first write edge pointer immediately prior to the copying based on a size of the first message.

3. The computing device of claim 2, wherein the computer-readable media comprise further computer-executable instructions, which, when executed, cause the computing device to:
   modify the first message to comprise a header prior to copying the first message into the first ring buffer, the header comprising an indication of the size of the first message.

4. The computing device of claim 2, wherein the computer-readable media comprise further computer-executable instructions, which, when executed, cause the computing device to:
   generate, from the first message, an error detecting code of the first message; and
   modify the first message to comprise a header prior to copying the first message into the first ring buffer, the header comprising the error detecting code of the first message.

5. The computing device of claim 4, wherein the computer-readable media comprise further computer-executable instructions, which, when executed, cause the computing device to:
   further modify the first message to comprise a footer prior to copying the first message into the first ring buffer, the footer also comprising the error detecting code of the first message.

6. The computing device of claim 1, wherein the computer- executable instructions causing the copying directly into the second ring buffer comprise further computer-executable instructions, which, when executed, cause the computing device to:
   copy the at least some of the first data directly into the second ring buffer based on a second write edge pointer that identifies, within the second ring buffer, where a previously copied data ended.

7. The computing device of claim 1, wherein the monitoring the second trailing edge pointer is triggered by the copying.

8. The computing device of claim 1, wherein the monitoring the second trailing edge pointer is triggered by a determination that a space left in the first ring buffer for the second data is below a pre-determined threshold, wherein the space left in the first ring buffer is based on the first write edge pointer and the first trailing edge pointer.

9. The computing device of claim 1, wherein the monitoring the second trailing edge pointer is triggered by a determination that a space left in the first ring buffer for the second data is insufficient to accommodate a second message comprising the second data, wherein the space left in the first ring buffer is based on the first write edge pointer and the first trailing edge pointer.

10. The computing device of claim 1, wherein the computer-executable instructions causing the monitoring are not executed if the first write edge pointer and the first trailing edge pointer identify a same location within the first portion of memory.

11. A computing device utilizing an improved flow control for remote direct memory access communications, the computing device comprising:
   one or more processing units;
   a network interface card; and
   one or more computer-readable media comprising computer-executable instructions, which, when executed by the processing units or the network interface card, cause the computing device to utilize the improved flow control for the remote direct memory access communications by:
      utilizing a first portion of memory as a first ring buffer such that a beginning data location at a beginning of the first portion of memory is used as a next storage location after an end data location at an end of the first portion of memory, thereby utilizing the first portion of memory in a recirculating manner;
      monitoring the first portion of memory to detect a second data being received from a sending computing device, the second new data being written into the first portion of memory based on a first write edge pointer that identifies an end, within the first portion of memory, of a first data that was received from the sending computing device prior to the second data;

updating the first write edge pointer to identify an end of the second data that was detected; and updating a first trailing edge pointer associated with the first ring buffer, after the first data has been copied out of the first ring buffer, from identifying a beginning of the first data prior to the updating of the first trailing edge pointer, to identify a beginning of the second data after the updating of the first trailing edge pointer.

12. The computing device of claim 11, wherein the second data is detected by detecting a header written into the first portion of memory based on the first write edge pointer.

13. The computing device of claim 11, wherein the computer-executable instructions causing the updating of the first write edge pointer comprise further computer-executable instructions, which, when executed, cause the computing device to:

increment the first write edge pointer in accordance with a size of the second data as specified in a header of the second data.

14. The computing device of claim 11, wherein the computer-readable media comprise further computer-executable instructions, which, when executed, cause the computing device to:

obtain an error detecting code associated with the second data; and verify the second data in the first ring buffer with the obtained error detecting code.

15. The computing device of claim 14, wherein the error detecting code is specified in both a header and a footer of the second data.

16. The computing device of claim 11, wherein the computer-readable media comprise further computer-executable instructions, which, when executed, cause the computing device to:

determine that the second data that was detected has completed being received from the sending computing device based on a footer of the second data comprising identifying information matching identifying information specified in a header of the second data.

17. The computing device of claim 11, wherein the computer-readable media comprise further computer-executable instructions, which, when executed, cause the computing device to:

provide, to an application executing on the computing device, a notification that the second data is in the first ring buffer; and receive, from the application, an indication that the second data has been copied out of the first ring buffer.

18. The computing device of claim 11, wherein the computer-readable media comprise further computer-executable instructions, which, when executed, cause the computing device to:

update a second time the first trailing edge pointer associated with the first ring buffer, after the second data has been copied out of the first ring buffer, such that the first trailing edge pointer, after the updating the second time the first trailing edge pointer, and the first write edge pointer, after the updating of the first write edge pointer, both identify a same location within the first portion of memory.

19. A method of improving flow control in remote direct memory access data communications between a sending computing device and a receiving computing device, the method comprising:

utilizing a first portion of a sending computing device memory as a send ring buffer;

utilizing a first portion of a receiving computing device memory as a receive ring buffer;

updating, at the sending computing device, a first write edge pointer associated with the send ring buffer to account for a first data being transmitted;

copying, by the sending computing device, at least some of the first data directly into the receive ring buffer at the receiving computing device based on a second write edge pointer associated with the receive ring buffer;

monitoring, at the receiving computing device, the receive ring buffer to detect a second data, the second data being a copy, in the receiving ring buffer, of the first data from the send ring buffer;

updating, at the receiving computing device, the second write edge pointer to identify an end of the second data that was detected;

updating, at the receiving computing device, a first trailing edge pointer associated with the receive ring buffer, after the second data has been copied out of the receive ring buffer at the receiving computing device;

monitoring, from the sending computing device, the first trailing edge pointer associated with the receive ring buffer on the receiving computing device, to detect the updating of the first trailing edge pointer at the receiving computing device; and updating, at the sending computing device, a second trailing edge pointer associated with the send ring buffer in accordance with the detected updating of the first trailing edge pointer.

20. The method of claim 19, wherein the monitoring the first trailing edge pointer is triggered by the copying.

* * * * *